United States Patent
Cheng et al.

(10) Patent No.: US 9,589,848 B2
(45) Date of Patent: Mar. 7, 2017

(54) FINFET STRUCTURES HAVING SILICON GERMANIUM AND SILICON CHANNELS

(71) Applicant: GLOBALFOUNDRIES INC., Grand Cayman (KY)

(72) Inventors: Kangguo Cheng, Schenectady, NY (US); Ali Khakifirooz, Mountain View, CA (US); Alexander Reznicek, Troy, NY (US); Ghavam G. Shahidi, Pound Ridge, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/678,024

(22) Filed: Apr. 3, 2015

(65) Prior Publication Data
US 2015/0214117 A1    Jul. 30, 2015

Related U.S. Application Data

(62) Division of application No. 13/950,173, filed on Jul. 24, 2013, now Pat. No. 9,093,533.

(51) Int. Cl.
*H01L 21/027*     (2006.01)
*H01L 21/205*     (2006.01)
(Continued)

(52) U.S. Cl.
CPC ........... *H01L 21/823807* (2013.01); *H01L 21/02381* (2013.01); *H01L 21/02532* (2013.01); *H01L 21/033* (2013.01); *H01L 21/2018* (2013.01); *H01L 21/2053* (2013.01); *H01L 21/308* (2013.01); *H01L 21/3065* (2013.01); *H01L 21/823431* (2013.01); *H01L 21/823821* (2013.01); *H01L 21/845* (2013.01); *H01L 27/0924* (2013.01); *H01L 27/1211* (2013.01); *H01L 29/16* (2013.01); *H01L 29/66795* (2013.01); *H01L 29/785* (2013.01); *H01L 29/7855* (2013.01); *H01L 29/66545* (2013.01)

(58) Field of Classification Search
CPC ............. H01L 21/845; H01L 21/02532; H01L 21/3086
See application file for complete search history.

(56) References Cited

U.S. PATENT DOCUMENTS 6,815,738 B2   11/2004 Rim
7,560,326 B2    7/2009 Mocuta et al.
(Continued)

*Primary Examiner* — Victor A Mandala
*Assistant Examiner* — Regan J Rundio
(74) *Attorney, Agent, or Firm* — Yuanmin Cai; Andrew M. Calderon; Roberts Mlotkowski Safran Cole & Calderon, P.C.

(57) ABSTRACT

Silicon and silicon germanium fins are formed on a semiconductor wafer or other substrate in a manner that facilitates production of closely spaced nFET and pFET devices. A patterned mandrel layer is employed for forming one or more recesses in the wafer prior to the epitaxial growth of a silicon germanium layer that fills the recess. Spacers are formed on the side walls of the patterned mandrel layer followed by removal of the mandrel layer. The exposed areas of the wafer and silicon germanium layer between the spacers are etched to form fins usable for nFET devices from the wafer and fins usable for pFET devices from the silicon germanium layer.

9 Claims, 6 Drawing Sheets

(51) Int. Cl.
   *H01L 21/308*    (2006.01)
   *H01L 29/78*     (2006.01)
   *H01L 21/8238*   (2006.01)
   *H01L 21/8234*   (2006.01)
   *H01L 29/66*     (2006.01)
   *H01L 21/02*     (2006.01)
   *H01L 21/20*     (2006.01)
   *H01L 21/033*    (2006.01)
   *H01L 21/84*     (2006.01)
   *H01L 27/092*    (2006.01)
   *H01L 27/12*     (2006.01)
   *H01L 21/3065*   (2006.01)
   *H01L 29/16*     (2006.01)

(56) References Cited

U.S. PATENT DOCUMENTS

| | | | |
|---|---|---|---|
| 7,910,413 B2 | 3/2011 | Zhu | |
| 7,993,999 B2 | 8/2011 | Basker et al. | |
| 8,159,018 B2 | 4/2012 | Akil et al. | |
| 8,211,759 B2 | 7/2012 | Anderson et al. | |
| 8,227,316 B2 | 7/2012 | Zhu et al. | |
| 8,298,897 B2 | 10/2012 | Chen et al. | |
| 8,828,818 B1 | 9/2014 | Rodder | |
| 8,889,495 B2* | 11/2014 | Cheng | H01L 27/1211 438/149 |
| 8,954,913 B1* | 2/2015 | Yuan | G06F 17/5068 716/126 |
| 8,975,168 B2* | 3/2015 | Liu | H01L 21/02664 438/149 |
| 9,000,498 B2* | 4/2015 | Morin | H01L 29/7849 257/288 |
| 9,087,687 B2* | 7/2015 | Adam | H01L 21/823807 |
| 9,093,260 B2* | 7/2015 | Adam | H01L 21/823807 |
| 9,190,419 B2* | 11/2015 | Chang | H01L 29/861 |
| 9,324,792 B1* | 4/2016 | Cao | H01L 21/02532 |
| 9,337,196 B2* | 5/2016 | Cheng | H01L 27/0924 |
| 9,356,046 B2* | 5/2016 | Cheng | H01L 27/1211 |
| 9,362,178 B1* | 6/2016 | Cao | H01L 21/02532 |
| 9,362,179 B1* | 6/2016 | Cheng | H01L 21/82382 |
| 9,362,182 B2* | 6/2016 | Cheng | H01L 21/845 |
| 2005/0230717 A1 | 10/2005 | Shima | |
| 2008/0057635 A1 | 3/2008 | Chen | |
| 2011/0180847 A1* | 7/2011 | Ikeda | H01L 29/045 257/190 |
| 2011/0204419 A1* | 8/2011 | Johnson | H01L 21/76895 257/204 |
| 2011/0260282 A1 | 10/2011 | Kawasaki | |
| 2012/0108016 A1 | 5/2012 | Kawasaki | |
| 2013/0119477 A1* | 5/2013 | Fumitake | H01L 21/823431 257/369 |
| 2014/0048804 A1* | 2/2014 | Cheng | H01L 21/0337 257/49 |
| 2014/0097518 A1 | 4/2014 | Cheng et al. | |
| 2014/0197456 A1* | 7/2014 | Wang | H01L 29/785 257/192 |
| 2014/0264488 A1 | 9/2014 | Fronheiser et al. | |
| 2014/0264595 A1 | 9/2014 | Basker et al. | |
| 2014/0264602 A1 | 9/2014 | Basker et al. | |
| 2014/0353760 A1 | 12/2014 | Loubet et al. | |
| 2014/0353767 A1* | 12/2014 | Liu | H01L 21/845 257/401 |
| 2014/0357060 A1 | 12/2014 | Liu et al. | |
| 2015/0097270 A1* | 4/2015 | Bedell | H01L 27/0924 257/618 |
| 2016/0005738 A1* | 1/2016 | Liu | H01L 27/0924 257/369 |

\* cited by examiner

FINFET STRUCTURES HAVING SILICON GERMANIUM AND SILICON CHANNELS

CROSS-REFERENCE TO RELATED APPLICATIONS

This patent application is a divisional of U.S. patent application Ser. No. 13/950,173 filed Jul. 24, 2013, the complete disclosure of which is expressly incorporated herein by reference in its entirety for all purposes.

FIELD

The present disclosure relates to the physical sciences, and, more particularly, to fin-type field effect transistor (FinFET) structures and methods of fabrication thereof.

BACKGROUND

Some types of field effect transistors (FETs) have three-dimensional, non-planar configurations including fin-like structures extending above semiconductor substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning. Gate-last procedures can involve making a dummy gate, fabricating other elements of the transistor, removing the dummy gate, and replacing the removed dummy gate with actual gate materials.

Hybrid channel FinFETs are characterized by the use of silicon channels in the nFET regions and silicon germanium channels in the pFET regions.

SUMMARY

Principles of the present disclosure provide an exemplary fabrication method that includes forming a patterned mandrel layer on a semiconductor substrate, the patterned mandrel layer including mandrel portions having side walls. One or more portions of the semiconductor substrate are recessed to form one or more trenches within the semiconductor substrate. The method further includes epitaxially growing a silicon germanium layer within the one or more trenches, forming spacers on the side walls of the mandrel portions, removing the mandrel portions from the semiconductor substrate, and removing portions of the semiconductor substrate and the silicon germanium layer between the spacers. A first plurality of parallel fins is thereby formed from the semiconductor substrate and a second plurality of parallel fins is formed from the silicon germanium layer.

A further exemplary method includes obtaining a structure comprising a semiconductor substrate having a top surface, one or more trenches within the semiconductor substrate, one or more silicon germanium regions within the one or more trenches, each of the one or more silicon germanium regions including a top surface coplanar with the top surface of the semiconductor substrate, a plurality of mandrel portions on the top surface of the substrate, the mandrel portions having sidewalls, and a plurality of spacers on the sidewalls of the mandrel portions. One or more semiconductor fins are formed from the semiconductor substrate. One or more silicon germanium fins are formed parallel to the one or more semiconductor fins from the one or more silicon germanium regions. Sidewall image transfer (SIT) is employed for forming the semiconductor and silicon germanium fins.

Structures usable for forming hybrid channel FinFET structures are provided in accordance with one or more exemplary embodiments. A first exemplary structure includes a substrate comprised of crystalline silicon, the substrate including a body portion and one or more first fins comprised of crystalline silicon extending from and integral with the body portion. The first exemplary structure further includes one or more second fins comprising silicon germanium and integral with the body portion of the substrate, the one or more second fins being parallel to the one or more first fins, at least one of the one or more second fins being within 30 nm or less of at least one of the one or more first fins.

A second exemplary structure is provided that is amenable to sidewall image transfer for forming parallel fins on a semiconductor substrate wherein one or more fins are comprised of the substrate material and other fin(s) are comprised of silicon germanium. The exemplary structure comprises a semiconductor substrate having a top surface, one or more trenches within the semiconductor substrate, one or more silicon germanium regions within the one or more trenches, each of the one or more silicon germanium regions including a top surface coplanar with the top surface of the semiconductor substrate. A plurality of mandrel portions are positioned on the top surface of the substrate, the mandrel portions having sidewalls. Spacers are positioned on the sidewalls of the mandrel portions.

Hybrid channel FinFET structures are disclosed in further exemplary embodiments. Such structures include closely spaced silicon and silicon germanium channels associated with n-type and p-type devices, respectively.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

FinFET structures and fabrication methods as disclosed herein can provide substantial beneficial technical effects. For example, one or more embodiments may provide one or more of the following advantages:

Hybrid fin channels with tight spacing between Si and SiGe fins, equal to the smallest fin spacing achieved in Si fin processing;
  Removal of defects at trench edges.

These and other features and advantages will become apparent from the following detailed description of illustrative embodiments thereof, which is to be read in connection with the accompanying drawings.

DETAILED DESCRIPTION

FinFET structures are characterized by fins formed on semiconductor substrates. Such substrates include bulk silicon substrates (fin on bulk) and SOI substrates (fin on SOI) as discussed above. The processes discussed below are applicable to fabrication of hybrid channel FinFET structures wherein sets of fins comprising silicon and silicon germanium are desired, and particularly where a silicon channel of an nFET device is to be closely spaced to a silicon germanium channel of a pFET device. FIGS. 1-8 illustrate exemplary steps that may be performed sequentially in fabricating a finned structure usable to form nFET and pFET devices, it being appreciated that additional steps may be necessary or desirable depending on the desired features of the structure. Fabrication may commence with a partially completed structure, in which case one or more of the steps described below could be omitted.

Figure 1:
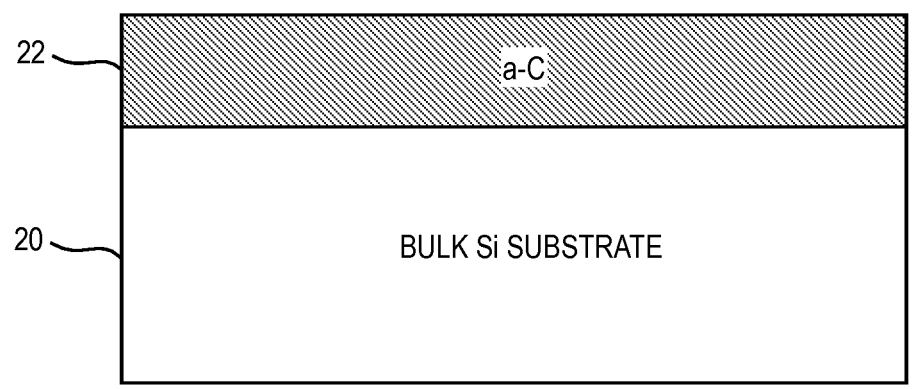
FIG. 1 is a schematic illustration of a bulk silicon substrate having a mandrel layer deposited thereon.

A bulk semiconductor substrate 20 comprised of crystalline silicon is shown in FIG. 1. The substrate may be in the form of a wafer that is essentially undoped or includes one or more doped regions, such as wells that are formed within the substrate by methods known in the art such ion implantation. A mandrel layer 22, for example amorphous carbon or silicon dioxide, is deposited on the substrate. The mandrel material can be deposited by methods such as chemical vapor deposition (CVD). A mandrel comprising multiple layers, such as a stack of amorphous Si and silicon dioxide may alternatively be employed.

Figure 2:
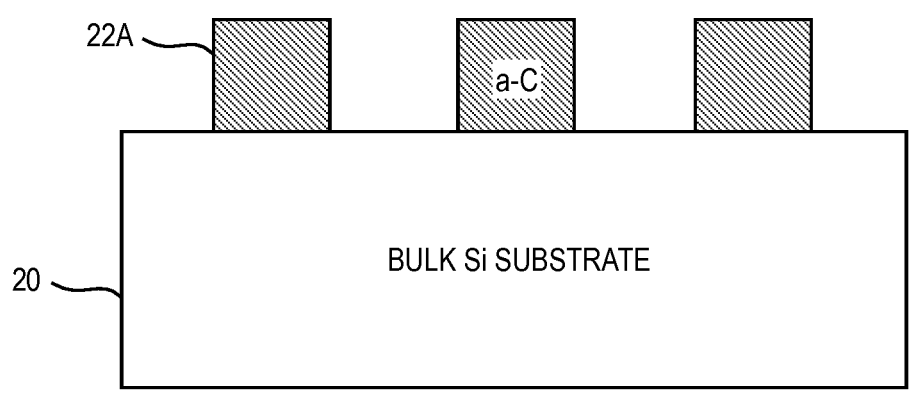
FIG. 2 is a schematic illustration of the step of patterning the mandrel shown in FIG. 1.

Referring to FIG. 2, the mandrel layer 22 is patterned using photolithographic and etching techniques. This may include steps of forming a photoresist layer on the surface of the wafer, for example by spin coating, exposing the photoresist to a light source through a mask and developing the photoresist as known in the art; subsequent etching of the mandrel, for example by a reactive ion etching (RIE) process, is followed by stripping the photoresist, for example by a plasma ashing process. The surface of the substrate accordingly includes exposed areas between the remaining portions 22A of the mandrel layer. The dimensions and spacing of the mandrel portions 22A correspond to the desired spacing of the fins comprising channels of nFET and pFET devices that are later formed on the substrate.

Figure 3:
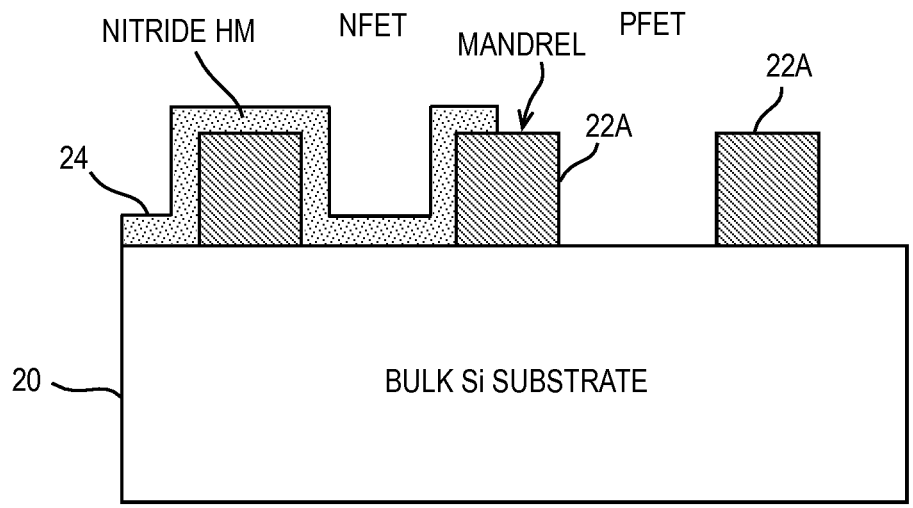
FIG. 3 is a schematic illustration showing the deposition and patterning of a mask layer on structure of FIG. 2.

Referring to FIG. 3, a hard mask 24 is deposited and patterned over the region of the structure intended for forming nFET devices. A nitride (silicon nitride ($Si_3N_4$)) hard mask is employed in one or more embodiments. Such a mask may be deposited using conventional deposition techniques such as spin-on coating, CVD, plasma-assisted CVD, or other known techniques. Conventional processes are further employed, such as applying and patterning a resist, etching, and removing resist, to remove a portion of the hard mask 24 from the region of the structure to be used as a pFET region. The mandrel portions 22A and areas of the substrate surface between mandrel portions are accordingly exposed in the pFET region of the structure. The exposed substrate surface and the mandrel portions in the nFET region are protected by the hard mask 24. Reactive ion etching is an exemplary process that may be employed to remove selected portions of the nitride hard mask 24.

Figure 4:
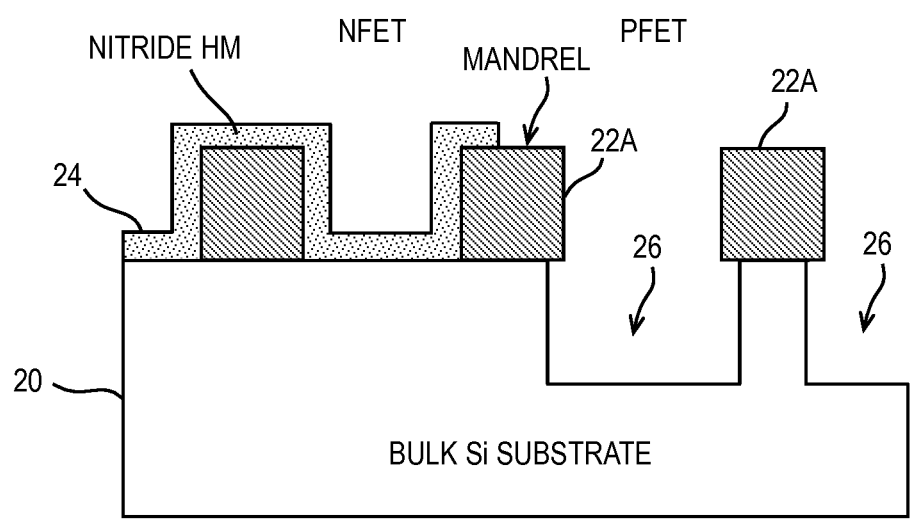
FIG. 4 is a schematic illustration showing the formation of a recess in the substrate.

Referring to FIG. 4, trenches 26 are formed in the pFET region of the substrate 20 between the mandrel portions 22A. The depths of the trenches are between ten and fifty nanometers in one or more embodiments. The trenches are formed using a RIE process in one or more embodiments. Optionally, a lateral pull back etching process can be performed during or after trench formation to extend the trenches laterally and partially beneath the mandrel portions 22A. An isotropic etch process may be employed for this purpose. Hydrofluoric nitric acid (HNA) may be employed for the isotropic etching of silicon. This process is timed so that the substrate is laterally etched by less than about 5 nm, so that the edge of the trench after the pull back is located under the mandrel. Since this process is an isotropic etch, the depth of the recessed region will also increase by a distance roughly equal to the distance etched laterally. This distance can be adjusted during the anisotropic RIE process that was used to form the recess (trench 26).

Figure 5:
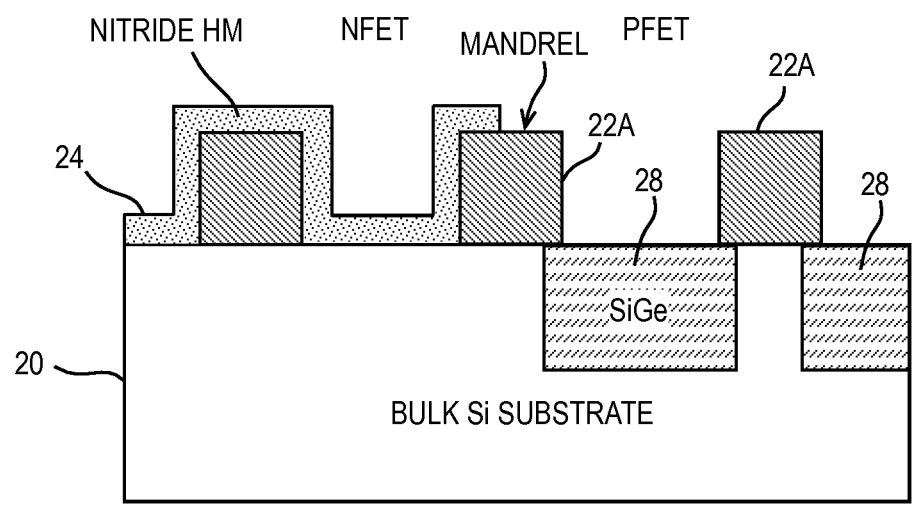
FIG. 5 is a schematic illustration showing growth of a silicon germanium layer on the substrate shown in FIG. 4.

Silicon germanium with a typical germanium atomic concentration of 10% to 60% (although lesser or greater concentrations can be used) is grown epitaxially on the structure shown in FIG. 4 using techniques such as chemical vapor deposition and using precursor gases such as silane and germane that are familiar to those of skill in the art. Such growth is selective to the exposed silicon surface of the substrate 20. Silicon germanium regions 28 having top surfaces that are substantially coplanar with the top surface of the substrate in the nFET region are thereby formed within the trenches 26 as shown in FIG. 5. It will be appreciated that a wafer-sized substrate may include additional trenches and silicon germanium regions, the schematic illustration showing only a portion of a substrate that can be employed.

Figure 6:
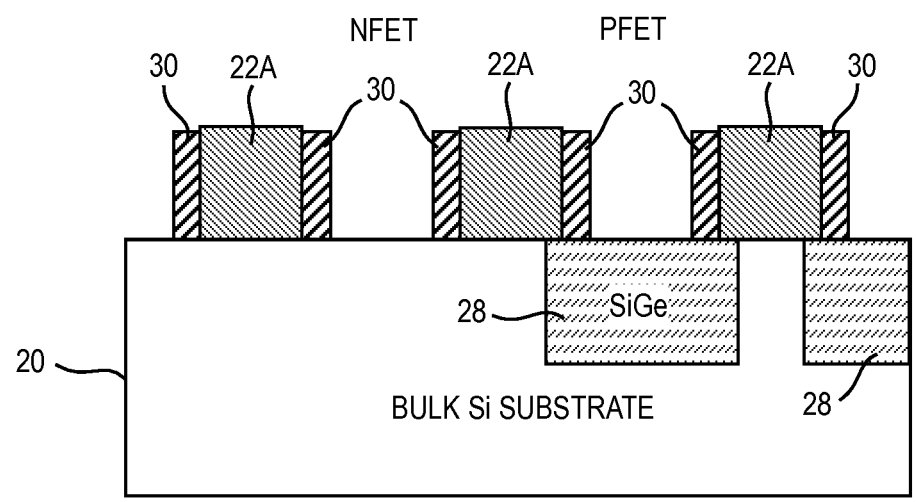
FIG. 6 is a schematic illustration showing removal of the mask and formation of spacers on the mandrel side walls.

Referring to FIG. 6, the hard mask 24 is removed from the nFET region of the structure shown in FIG. 5. Hot phosphoric acid may be employed for such removal if the hard mask is a nitride mask. Following such removal, Sidewall Image Transfer (SIT) is employed to form fins of desired thickness. A conformal dielectric layer (e.g. nitride) is deposited on the substrate using, for example, low pressure chemical vapor deposition. Subsequently, an anisoptropic etch such as RIE of the dielectric layer leaves dielectric sidewall material on the mandrel portions 22A, forming spacers 30 on the sidewalls of the mandrel portions 22A. In one or more embodiments, nitride spacers are formed. Oxide (for example, silicon oxide) spacers may alternatively be formed. SIT facilitates the fabrication of fins that are smaller in spacing than photolithographic techniques permit. The SIT process forms features (such as fins) with a pitch equal to half of the smallest pitch obtainable with lithography. For example, with the state-of-the-art UV sources at 193 nm wavelength the smallest pitch that can be formed with conventional lithography is about 80 nm; the SIT process can generate fins with a pitch of about 40 nm.

Figure 7:
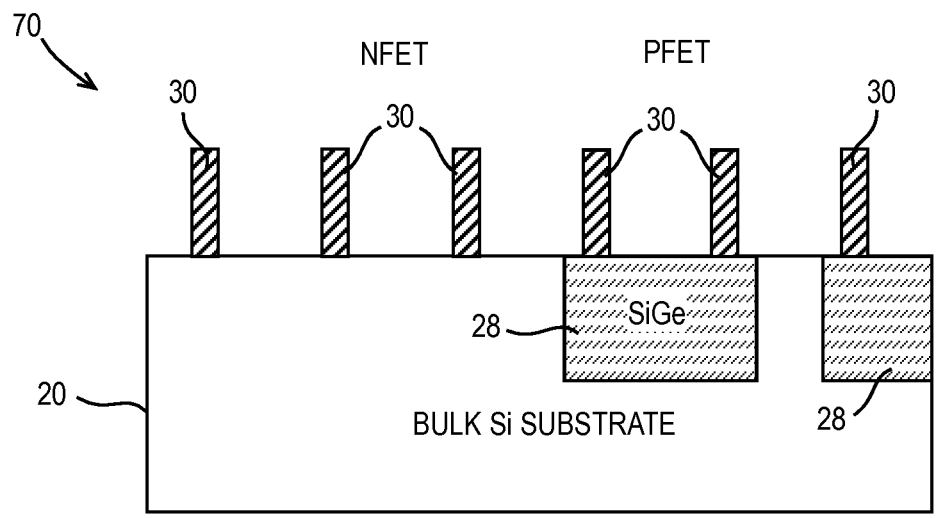
FIG. 7 is a schematic illustration showing removal of the mandrel layer.

The mandrel portions 22A are selectively removed by, for example, reactive ion etching to form the structure 70 shown in FIG. 7. The structure 70 in an exemplary embodiment includes a silicon substrate 20, the silicon germanium regions 28, and an array of equally spaced, parallel spacers 30. Some of the spacers adjoin the surface of the silicon substrate while others adjoin the surfaces of the germanium regions 28. The widths of the spacers 30 correspond in thickness to the widths of the fins to be formed later in the FinFET fabrication process. The widths of the mandrel portions 22A, which are thirty nanometers or less in one or more embodiments, correspond to the distance to be formed between pairs of fins. As discussed below, the process allows the fabrication of silicon and silicon germanium channels of FinFET devices that are closely spaced.

Parallel fins 32, 34 are formed from the substrate 20 and silicon germanium regions 28. Reactive ion etching (RIE) through the gaps between spacers 30 is employed in one or more exemplary embodiments to form trenches within the substrate and silicon germanium regions. The same RIE procedure can be used to form both silicon and silicon germanium fins. The fins 32 formed from the substrate 20 are silicon while the fins 34 formed in the silicon germanium regions comprise silicon germanium. In the exemplary structure 80 shown in FIG. 8, etching extends beyond the depth of the silicon germanium regions and into the silicon substrate. The portion of the trench extending into the substrate beyond the silicon germanium region is filled with a dielectric material at a later step to provide electrical isolation between the fins. The fins 34 in the pFET region accordingly include silicon base portions though the channels formed by such fins in subsequently formed pFET devices will indeed comprise silicon germanium. Nitride caps 36 adjoin the top surfaces of the fins 32, 34. The caps 36, which are the portions of the spacers 30 remaining following formation of the fins, are typically removed before further processing is conducted. It will be appreciated that the fins 32, 34 formed in the above manner may not be identical in height and may not have sidewalls that are entirely vertical. The bottoms of the fins may be larger in width than the top portions thereof. Assuming each of the mandrel portions 22A has the same width, the distance between pairs of fins formed beneath each pair of spacers will be substantially the same in one or more embodiments. The mandrel portions 22A are equally spaced in one or more embodiments such that the distances between the spacers 30 of adjoining mandrel portions are the same as the widths of the mandrel portions. In such embodiments, all of the fins 32, 34 will be equally spaced from each other as the spacers 30 are equally spaced. The processes described herein allow the fabrication of hybrid channel FinFET devices wherein a silicon fin 32 can be within 30 nm or less of the nearest silicon germanium fin 34. This enables nFET and pFET devices to be fabricated in closer proximity than is possible using conventional processes. A further advantage of the disclosed processes is the removal of any epitaxial defects at the trench edges after fin RIE.

Figure 8:
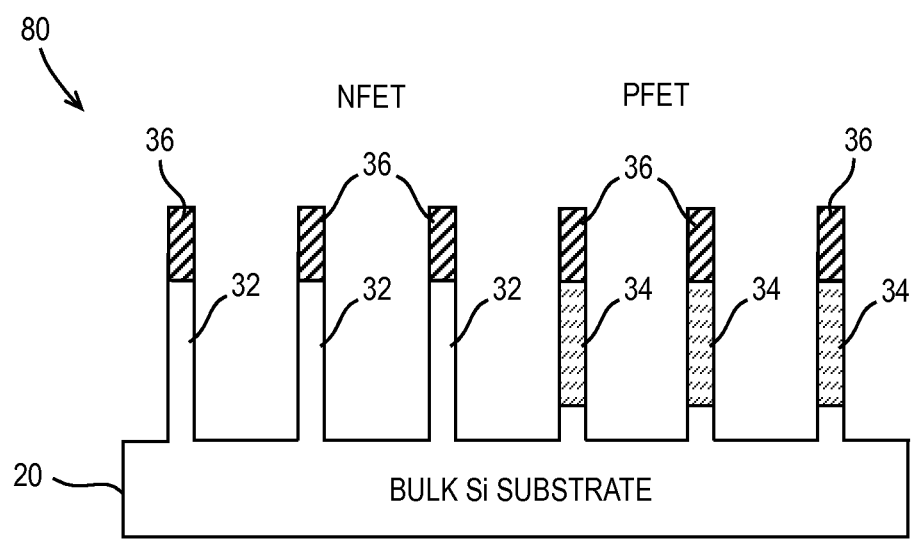
FIG. 8 is a schematic illustration showing a finned structure following reactive ion etch.

Once the structure 80 shown in FIG. 8 is obtained, further processing is conducted in accordance with manufacturer requirements and preferences. Deposition of a dielectric material, such as an oxide material, to fill the volumes between fins is followed by a controlled etch-back that determines fin heights. Impurities can be introduced below the fins to provide a punchthrough stop. Such processing steps are familiar to those of skill in the art and continue to evolve.

Technology for forming pFET and nFET devices on finned structures is known and also continues to be developed. The gates of FinFETs can be formed using a "gate-first" process wherein a gate stack and spacers are formed prior to selective epitaxial growth on the fins wherein source and drain regions are enlarged. A "gate-last" process may alternatively be employed. Gate-last procedures can involve making a dummy gate, fabricating other elements of the transistor, removing the dummy gate, and replacing the removed dummy gate with actual gate materials.

If a gate-first process as described above is employed, gate materials may comprise a gate dielectric (e.g., high-k such as hafnium oxide) and a gate conductor (e.g., metal gate). Any suitable deposition technique can be used to deposit high-k and metal gate, including but not limited to atomic layer deposition, chemical vapor deposition, physical vapor deposition, sputtering, plating, etc. Gate material can be formed both above and between the fins in some embodiments or, alternatively, only between the fins. Dielectric spacers are formed around the gate structure. If a gate-last process is employed, a dummy gate (not shown) is formed wherein the dummy gate may comprise a dummy gate dielectric (e.g., oxide) covering fins and a dummy gate material (e.g., polysilicon) on top of the dummy gate dielectric. This dummy gate is removed in a later process familiar to those of skill in the art and a replacement metal gate composition is patterned at an appropriate stage of the transistor fabrication process. Fin heights, widths and spacing are further chosen in accordance with manufacturer preferences. Fin heights in some embodiments range between 10-50 nm.

Once gate structures have been formed on the finned structure, source/drain regions are formed on the fins by diffusion, implantation or other techniques familiar to those of skill in the art. In some embodiments, a layer (not shown) of doped material (for example, silicon germanium) may be grown epitaxially or otherwise deposited on the structure, causing the source/drain regions to be merged in some embodiments or form diamond-shaped, unmerged structures in other embodiments. In the fabrication of a pFET structure, boron-doped SiGe can be employed in one or more embodiments for the epitaxial growth of volumes (not shown) on the sidewalls of the silicon germanium fins 34. To fabricate nFET structures, volumes are formed with phosphorus-doped silicon (Si:P) in some embodiments. The doping can be chosen as desired for particular transistor applications. In one exemplary embodiment where the doped source/drain semiconductor material is SiGe, the dopant is boron in a concentration ranging 4-7e20 and the resulting FinFET structure is p-type. Further fabrication steps are performed, some of which depend on the particular FinFET structure to be obtained. Typically the grid comprising the parallel fins and gate structures is filled with a low k dielectric material. Depending on the type of gate processing employed (gate-first or gate-last), appropriate steps are also taken to complete gate fabrication. It will be appreciated that one or more of the fabrication steps may include other intermediary steps such as etching and masking.

An alternative structure 100 fabricated using techniques substantially as described above is provided in a further embodiment. The steps described above with respect to FIGS. 1-7 are performed to obtain the structure 70 shown in FIG. 7. A mask 102 (e.g. nitride) is deposited and patterned such that it covers two spacers and portions of the surfaces of the silicon substrate 20 and silicon germanium region 28. Reactive ion etch removes silicon and silicon germanium from the areas between the spacers except for the areas protected by the mask 102. An intermediate region 104 including a silicon portion and an adjoining silicon germanium portion is thereby formed in the n/p boundary that can be used for other electronic devices, for example tunnel FET devices. The intermediate region 104 has a height above the base portion of the substrate substantially equal to that of the fins 32, 34. As discussed above, fin heights may not be identical. The height of the region 104 with respect to the substrate base will be about the same as the average fin height. The bottom of the intermediate region 104, like the bottoms of the fins, may be wider than the top portion thereof.

Figure 9:
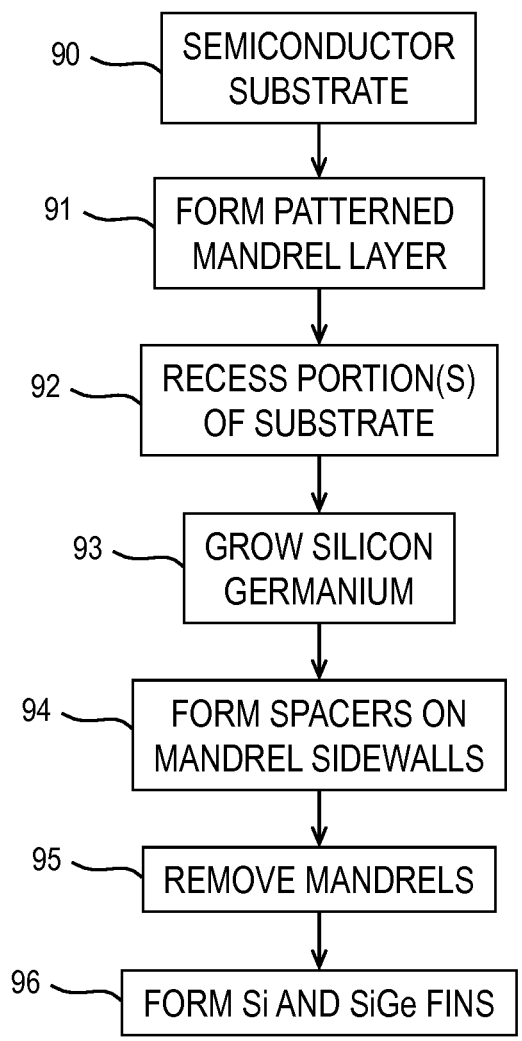
FIG. 9 is a flow chart illustrating an exemplary fabrication process.

An exemplary method of obtaining a finned structure suitable for hybrid channel FinFET devices is shown in FIG. 9. The method facilitates the manufacture of closely spaced hybrid channel FinFET (silicon nFET and SiGe pFET) devices. It will be appreciated that the structures described herein may be part of a design for an integrated circuit chip. The chip design may be created in a graphical computer programming language and stored in a non-transitory computer storage medium such as a disk, tape, physical hard drive or virtual hard drive. The stored design can be converted to an appropriate format for the fabrication of photolithographic masks that define areas of the wafer to be etched or otherwise processed. Referring to FIG. 9, a semiconductor substrate such as a bulk silicon wafer is obtained in a first step 90 of the process. In a second step 91, a patterned mandrel layer is formed on the substrate. The third step 92 includes recessing a portion of the semiconductor substrate by using the patterned mandrel layer as a mask. Epitaxial growth of silicon germanium on the substrate is a fourth step 93 that follows the recessing step 92, the mandrel layer defining the silicon germanium region(s). A fifth step 94 includes forming spacers (e.g. nitride or oxide) on the mandrel sidewalls. The sixth step 95 includes removing the mandrel layer, leaving the spacers formed in the previous step. The seventh step includes forming fins with different channel materials wherein the different fins have the same spacing. Silicon fins that do not contain silicon germanium are used in the subsequent fabrication of nFET devices on the substrate while silicon germanium fins are used for pFET devices.

Figure 10:
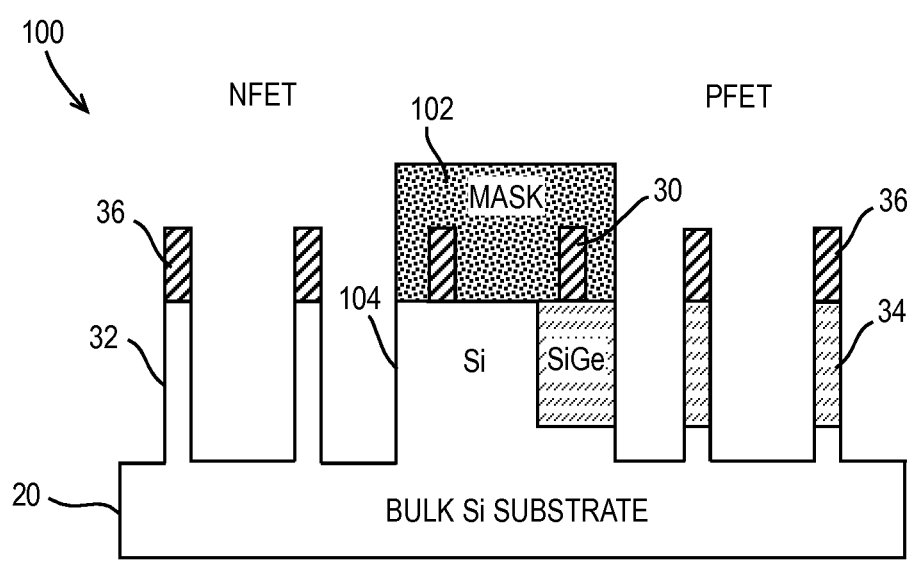
FIG. 10 is a schematic illustration showing an alternative embodiment wherein a boundary area is formed for fabrication of a further electronic device.

Given the discussion thus far and with reference to the exemplary embodiments discussed above and the drawings, it will be appreciated that, in general terms, an exemplary fabrication method includes obtaining a structure comprising a semiconductor substrate having a top surface, one or more trenches 26 within the semiconductor substrate, one or more silicon germanium regions 28 within the one or more trenches, each of the one or more silicon germanium regions including a top surface coplanar with the top surface of the semiconductor substrate 20, a plurality of mandrel portions 22A on the top surface of the substrate, the mandrel portions having sidewalls, and a plurality of spacers 30 on the sidewalls of the mandrel portions. FIG. 6 shows an exemplary structure. One or more semiconductor fins 32 are formed from the semiconductor substrate. One or more silicon germanium fins 34 are formed parallel to the one or more semiconductor fins from the one or more silicon germanium regions 28, as shown in the exemplary structure 80 depicted in FIG. 8. The method, in some embodiments, further includes forming at least one n-type FinFET device using the one or more semiconductor fins and at least one p-type FinFET device using the one or more silicon germanium fins. In some embodiments, at least one fin 34 comprising silicon germanium is formed within less than 30 nm of one of the fins 32 formed from the semiconductor substrate. In some exemplary embodiments, such as that shown in FIG. 10, the method further includes forming a mask 102 over the top surface of the semiconductor substrate and the top surface of one of the one or more silicon germanium regions, and forming an intermediate region 104 beneath the mask 102 including a silicon portion and a silicon germanium portion adjoining the silicon portion.

A further exemplary fabrication method includes forming a patterned mandrel layer on a semiconductor substrate, the patterned mandrel layer including mandrel portions having sidewalls. FIGS. 1-2 illustrate the formation and patterning of such a layer 22. One or more portions of the semiconductor substrate are recessed to form one or more trenches 26 within the semiconductor substrate 20. The method further includes epitaxially growing a silicon germanium layer 28 within the one or more trenches, forming spacers 30 on the side walls of the mandrel portions, removing the mandrel portions 22A from the semiconductor substrate such as shown in FIG. 7, and removing portions of the semiconductor substrate and the silicon germanium layer between the spacers. A first plurality of parallel fins 32 is thereby formed entirely from the semiconductor substrate and a second plurality of parallel fins 34 is formed at least in part from the silicon germanium layer, such as shown in FIG. 8. The semiconductor substrate 20 comprises bulk silicon in one or more embodiments. In some embodiments, the method further includes forming n-type FinFET devices on the first plurality of fins and p-type FinFET devices on the fins formed from the silicon germanium layer. The exemplary method includes, in some embodiments, forming a mask 24 over a selected region of the semiconductor substrate and selected mandrel portions in the selected region of the semiconductor substrate prior to recessing the one or more portions of the semiconductor substrate and removing the mask following the step of epitaxially growing the silicon germanium layer. FIGS. 3 and 6 illustrate mask formation and subsequent removal.

An exemplary structure provided in accordance with the disclosure includes a substrate 20 comprised of crystalline silicon, the substrate including a body portion and one or more first fins 32 comprised of crystalline silicon extending from and integral with the body portion. The first exemplary structure further includes one or more second fins 34 comprising silicon germanium and integral with the body portion of the substrate, the one or more second fins being parallel to the one or more first fins, at least one of the one or more second fins 34 being within 30 nm or less of at least one of the one or more first fins 32. In one or more embodiments, such as shown in FIG. 8, the one or more second fins 34 includes a silicon base integral with the body portion of the substrate 20 and a silicon germanium portion integral with the silicon base. The first and second fins are equally spaced from each other in one or more embodiments. The second fins have a germanium atomic concentration of ten to sixty percent in some embodiments of the first exemplary structure.

A second exemplary structure is provided that is amenable to sidewall image transfer for forming parallel fins on a semiconductor substrate wherein one or more fins 32 are comprised of the substrate material and other fin(s) 34 are comprised of silicon germanium. The exemplary structure comprises a semiconductor substrate 20 having a top surface, one or more trenches 26 within the semiconductor substrate, one or more silicon germanium regions 28 within the one or more trenches, each of the one or more silicon germanium regions including a top surface coplanar with the top surface of the semiconductor substrate. A plurality of mandrel portions 22A are positioned on the top surface of the substrate, the mandrel portions having sidewalls. Spacers 30 are positioned on the sidewalls of the mandrel portions. FIG. 6 illustrates an exemplary embodiment of the second exemplary structure.

Those skilled in the art will appreciate that the exemplary structures discussed above can be distributed in raw form (a single wafer having multiple unpackaged chips), as bare dies, in packaged form, or incorporated as parts of intermediate products or end products that benefit from having FinFET devices therein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. A method comprising:
   forming a patterned mandrel layer on a semiconductor substrate, the patterned mandrel layer including mandrel portions having side walls;
   recessing one or more portions of the semiconductor substrate to form one or more trenches within the semiconductor substrate;
   epitaxially growing a silicon germanium layer within the one or more trenches;
   forming spacers on the side walls of the mandrel portions;
   removing the mandrel portions from the semiconductor substrate;
   removing portions of the semiconductor substrate and the silicon germanium layer between the spacers, thereby forming a first plurality of parallel fins from the semiconductor substrate and a second plurality of parallel fins from the silicon germanium layer;
   forming a mask over a selected region of the semiconductor substrate and selected mandrel portions in the selected region of the semiconductor substrate prior to recessing the one or more portions of the semiconductor substrate; and
   removing the mask following the step of epitaxially growing the silicon germanium layer, wherein the semiconductor substrate comprises a bulk silicon substrate.

2. The method of claim 1, further including a step of forming n-type FinFET devices using the first plurality of fins and p-type FinFET devices using the second plurality of fins formed from the silicon germanium layer.

3. The method of claim 2, wherein the step of forming the patterned mandrel layer further includes forming equally spaced mandrel portions of equal width.

4. The method of claim 1, wherein both the first and second plurality of fins have heights of less than fifty nanometers.

5. The method of claim 1, wherein the step of removing portions of the semiconductor substrate and the silicon germanium layer between the spacers includes performing a reactive ion etch.

6. The method of claim 1, wherein the step of forming the first plurality of fins from the semiconductor substrate and the second plurality of fins from the silicon germanium layer further includes forming at least one fin comprising silicon germanium parallel to and within less than 30 nm of one of the first plurality of fins formed from the semiconductor substrate.

7. The method of claim 6, wherein the silicon germanium layer has a germanium atomic concentration of ten to sixty percent.

8. A method comprising:
   forming a patterned mandrel layer on a semiconductor substrate, the patterned mandrel layer including mandrel portions having side walls;
   recessing one or more portions of the semiconductor substrate to form one or more trenches within the semiconductor substrate;
   epitaxially growing a silicon germanium layer within the one or more trenches;
   forming spacers on the side walls of the mandrel portions;
   removing the mandrel portions from the semiconductor substrate;
   removing portions of the semiconductor substrate and the silicon germanium layer between the spacers, thereby forming a first plurality of parallel fins from the semiconductor substrate and a second plurality of parallel fins from the silicon germanium layer; and
   forming a mask on a portion of the semiconductor substrate, a portion of the silicon germanium layer adjoining the semiconductor substrate, and a plurality of the spacers prior to forming both the first and second plurality of fins, wherein the semiconductor substrate comprises a bulk silicon substrate.

9. The method of claim 8, further including the step of forming n-type FinFET devices using the first plurality of fins and p-type FinFET devices using the second plurality of fins formed from the silicon germanium layer.

* * * * *